United States Patent [19]

Hioki et al.

[11] Patent Number: 5,080,997
[45] Date of Patent: Jan. 14, 1992

[54] PROCESS FOR PREPARING A POSITIVE RESIST COMPOSITION BY MIXING THE CONDENSATION PRODUCT OF A QUINONE DIAZIDE SULFONYL HALOGENIDE AND A PHENOL WITH A RESIN SOLUTION WITHOUT ISOLATING THE CONDENSATION PRODUCT FROM THE CRUDE MIXTURE

[75] Inventors: Takeshi Hioki, Tondabayashi; Koji Kuwana, Osaka; Jun Tomioka, Hyogo; Hirotoshi Nakanishi, Osaka; Yasunori Uetani, Osaka; Yukio Hanamoto, Osaka; Fumio Oi, Hyogo, all of Japan

[73] Assignee: Sumitomo Chemical Company, Limited, Osaka, Japan

[21] Appl. No.: 446,153

[22] Filed: Dec. 5, 1989

[30] Foreign Application Priority Data

Dec. 6, 1988 [JP] Japan .................... 63-308559

[51] Int. Cl.$^5$ .............................. G03F 7/022
[52] U.S. Cl. ..................... 430/168; 430/192; 430/193; 430/169; 528/482; 528/499; 528/501
[58] Field of Search ............... 430/168, 169, 175, 192, 430/193; 528/501, 482, 499

[56] References Cited

U.S. PATENT DOCUMENTS

| | | | |
|---|---|---|---|
| 4,550,069 | 10/1985 | Pampalone et al. | 430/192 |
| 4,555,469 | 11/1985 | Erdmann et al. | 430/192 |
| 4,696,886 | 9/1987 | Hanabata et al. | 430/192 |
| 4,719,167 | 1/1988 | Miura et al. | 430/192 |
| 4,731,319 | 3/1988 | Kohara et al. | 430/192 |
| 4,859,563 | 8/1989 | Miura et al. | 430/192 |
| 4,863,828 | 9/1989 | Kawabe et al. | 430/192 |
| 4,871,645 | 10/1989 | Uenishi et al. | 430/192 |

FOREIGN PATENT DOCUMENTS 3727848  3/1989  Fed. Rep. of Germany.
2173074  2/1973  France.

Primary Examiner—Charles L. Bowers, Jr.
Assistant Examiner—John S. Y. Chu
Attorney, Agent, or Firm—Birch, Stewart, Kolasch & Birch

[57] ABSTRACT

A process for preparing a positive resist composition, which process includes the steps of condensation reacting a quinone diazide sulfonyl halogenide with a phenol compound, mixing a condensation reaction mixture with a solution of an alkali-soluble resin in a resist solvent and removing impurities from the mixture, whereby the overall processing time can be shortened.

22 Claims, No Drawings

PROCESS FOR PREPARING A POSITIVE RESIST COMPOSITION BY MIXING THE CONDENSATION PRODUCT OF A QUINONE DIAZIDE SULFONYL HALOGENIDE AND A PHENOL WITH A RESIN SOLUTION WITHOUT ISOLATING THE CONDENSATION PRODUCT FROM THE CRUDE MIXTURE

BACKGROUND OF THE INVENTION

1. Field of the Invention

The present invention relates to a process for preparing a positive resist composition including a quinone diazide compound.

2. Description of the Related Art

A positive resist composition comprising an alkali-soluble resin and a quinone diazide compound is used in the production of integrated circuits by photographic etching.

Hitherto, a positive resist composition has been prepared by mixing an isolated quinone diazide sulfonic ester with an alkali-soluble resin, a resist solution and so on. Namely, a quinone diazide sulfonyl halogenide undergoes a condensation reaction with a phenol compound in the presence of an alkali in a polar organic solvent such as dioxane, methyl ethyl ketone or mixtures thereof. After the condensation reaction, additional steps including precipitation with, for example, water or methanol, filtering, drying and isolation of the quinone diazide sulfonic ester are required to remove the polar organic solvent used in the condensation reaction step and impurities such as salt by-produced in the condensation reaction and water.

In this process, a processing time is greatly prolonged, because the process includes the steps with inefficient operability and productivity such as filtration and drying.

Another process includes adding a resist solvent to the resulting solution from the condensation reaction without precipitation, filtering or drying, then removing the impurities from the mixture and recovering a solution of the quinone diazide sulfonyl ester in the resist solvent. However, since the solubility of the quinone diazide sulfonyl ester in the resist solvent is low, the quinone diazide sulfonyl ester is easily precipitated in the resist solvent.

Therefore, it is difficult to employ these processes industrially.

SUMMARY OF THE INVENTION

An object of the present invention is to provide a process for preparing a positive resist composition in a short processing time.

Accordingly, the present invention provides a process for preparing a positive resist composition, which process comprises the steps of condensation reacting a quinone diazide sulfonyl halogenide with a phenol compound, mixing a condensation reaction mixture with a solution of an alkali-soluble resin in a resist solvent and removing impurities from the mixture.

DETAILED DESCRIPTION OF THE INVENTION

The quinone diazide sulfonyl halogenide is condensation reacted with the phenol compound in a solvent to obtain a solution of the quinone diazide sulfonyl ester.

Examples of the phenol compound are (poly)hydroxybenzenes (e.g. cresol and resorcinol), (poly)hydroxyphenyl alkyl ketones (e.g. 2,4-dihydroxyphenyl propyl ketone), (poly)hydroxyphenyl aryl ketones (e.g. 2,3,4-trihydroxybenzophenone and 2,3,4,4'-tetrahydroxybenzophenone), bis[(poly)hydroxyphenyl]alkanes (e.g. 2,2-bis(2,4-dihydroxyphenyl)propane), (poly)hydroxyphenyl aryl alkanes (e.g. 2-(4-hydroxyphenyl)-2-(2,4-dihydroxyphenyl)propane, and the like.

As the solvent, polar organic solvents are preferably used. Such solvents include dioxane, methyl ethyl ketone, cyclohexanone or $\gamma$-butyrolactone. These solvents may be used alone or in combination.

Examples of the quinone diazide sulfonyl ester are 1,2-benzoquinone diazide-4-sulfonyl ester, 1,2-naphthoquinone diazide-4-sulfonyl ester, 1,2-naphthoquinone diazide-5-sulfonyl ester and the like.

A molar ratio of the phenol compound to the quinone diazide sulfonyl halogenide is preferably from 1:1 to 1:4.

The condensation reaction can be carried out in the presence of a base catalyst. Examples of the base catalysts are amines such as triethyl amine, inorganic bases such as sodium hydroxide, sodium carbonate and sodium hydrogen-carbonate, and mixtures thereof. The amount of the base catalyst is from 1 to 1.5 moles per one mole of the quinone diazide sulfonyl halogenide.

The solution of the quinone diazide sulfonyl ester is mixed with the solution of the alkali-soluble resin in the resist solvent.

The weight ratio of the quinone diazide sulfonyl ester to the alkali-soluble resin is preferably from 1:1 to 1:1.5.

A novolak resin is preferably used as the alkali-soluble resin. The novolak resins are prepared by a condensation reaction of a phenol compound (e.g. phenol and cresol) with formaldehyde such as formalin.

Examples of the resist solvent are ethyl cellosolve acetate, methyl cellosolve acetate, ethyl cellosolve, methyl cellosolve, propyleneglycolmonomethylether acetate, butyl acetate, methyl isobutyl ketone, xylene and the like.

The concentration of the alkali-soluble resin in the resist solvent is preferably from 10 to 60 % by weight.

By the above described process, impurities such as the solvent used in the condensation reaction are removed from the solution containing the alkali-soluble resin and the quinone diazide sulfonyl ester. The solvent can be removed by evaporation. The salts by-produced through the condensation reaction are removed by filtration. The salts and other metals may be removed by washing with water. Water can be also removed by evaporation.

The positive resists are prepared by controlling a concentration of the solution without impurity, if necessary and filtrating the solution to remove minuter dusts.

By the process of the present invention, filtration or drying step can be omitted and the processing time can be shortened.

The present invention will be illustrated more in detail with the following Examples, in which "parts" and "%" are by weight.

EXAMPLE 1

36.93 Grams of 2,3,4,4'-tetrahydroxybenzophenone, 108.8 g of 1,2-naphthoquinone-2-diazide-5-sulfonyl chloride and 728.80 g of 1,4-dioxane were mixed and stirred to achieve complete dissolution. 43.03 Grams of triethylamine was dropwise added over 30 minutes at 20°–25 ° C. After stirring for further 2 hours at 20°–25 ° C., the reaction mixture was filtered to separate triethylamine hydrochloride. 1157.80 Grams of a solution of a cresol novolak resin in ethyl cellosolve acetate (weight average molecular weight of the novolak resin: 9,000; and concentration: 35.0 %) and 2.40 g of acetic acid were added to the filtrate and stirred for 20 minutes at 20°-25° C. From the mixture, 1,4-dioxane was distilled off under 20 Torr at 30° C. After restoring the pressure, 275 g of ethyl cellosolve acetate and 1100 g of ion exchanged water was added and the mixture was kept standing for 30 minutes. After removing the upper layer, 240 g of ethyl cellosolve acetate and 900 g of ion exchanged water was added. The same extraction was repeated twice. After the upper layer was discarded, 600 g of ethyl cellosolve acetate was added, and then remaining water was distilled off under 20 Torr at 40° C. 430.3 Grams of ethyl cellosolve acetate was added to 1493.5 g of the resulting mixture to obtain a resist solution. The resist solution was filtered through a Teflon (trade mark) filter of 0.2 μm in pore size.

The overall processing time was 10 hours.

COMPARATIVE EXAMPLE 1

36.93 Grams of 2,3,4,4'-tetrahydroxybenzophenone, 108.8 g of 1,2-naphthoquinone-2-diazide-5-sulfonyl chloride and 728.80 g of dioxane were mixed and stirred to achieve complete dissolution. 43.30 Grams of triethylamine was dropwise added over 30 minutes at 20°-25° C. After stirring for further 2 hours at 20°-25° C., the reaction mixture was filtered to separate triethylamine hydrochloride. The filtrate was charged into 2700 g of ion exchanged water. Then, 13.56 g of acetic acid was added and stirred for 1 hour at 20°-25° C. The reaction solution was filtered to obtain a cake of quinone diazide sulfonyl ester. The cake was washed with 600 g of ion exchanged water three times and dried for 50 hours at 40° C. to obtain a dry cake. 129.4 Grams of the dry cake, 1157.8 g of a solution of cresol novolak resin in ethyl cellosolve acetate (weight average molecular weight of the novolak resin: 9000; and concentration: 35.0 %) and 651.5 g of ethyl cellosolve acetate was mixed. The mixed resist solution was filtered through a Teflon (Trade mark) filter of 0.2 μm in pore size to obtain a positive resist solution.

The overall processing time was 58 hours.

What is claimed is:

1. A process for preparing a positive resist composition, which process comprises the steps of:
   condensation reacting a quinone diazide sulfonyl halogenide with a phenol compound in a condensation reaction solvent to form a condensation reaction mixture;
   mixing the condensation reaction mixture with a solution of an alkali-soluble resin in a resist solvent without isolating a quinone diazide sulfonyl ester from the condensation reaction mixture to form a second mixture;
   evaporating said condensation reaction solvent from the second mixture to form a third mixture;
   washing the third mixture with water to form a fourth mixture; and
   evaporating the water from said fourth mixture to prepare said positive resist composition.

2. The process for preparing a positive resist composition according to claim 1, wherein the alkali-soluble resin is a novolak resin.

3. The process for preparing a positive resist composition according to claim 1, wherein the weight ration of the quinone diazide sulfonyl ester to the alkali-soluble resin is 1:1 to 1:1.5.

4. The process for preparing a positive resist composition according to claim 3, wherein the alkali-soluble resin is a novolak resin.

5. The process for preparing a positive resist composition according to claim 1, wherein the resist solvent is a member selected from the group consisting of ethyl cellosolve acetate, methyl cellosolve acetate, ethyl cellosolve, methyl cellosolve, propyleneglycolmonomethylether acetate, butyl acetate, methyl isobutyl ketone, and xylene.

6. The process for preparing a positive resist composition according to claim 1, wherein the concentration of the alkali-soluble resin in the resist solvent is from 10 to 60% by weight.

7. The process for preparing a positive resist composition according to claim 1, wherein the third mixture is subjected to filtration to remove salts produced by the condensation reaction before being washed with water.

8. The process for preparing a positive resist composition according to claim 1, which further comprises subjecting the prepared positive resist composition or one of the mixtures formed during the preparation thereof to filtration to remove impurities.

9. The process for preparing a positive resist composition according to claim 1, wherein said phenol compound is selected from the group consisting of (poly)hydroxybenzenes, (poly(hydroxyphenyl alkyl ketones, (poly)hydroxyphenyl aryl ketones, bis{(poly)hydroxyphenyl}alkanes and (poly)hydroxyphenyl aryl alkanes.

10. The process for preparing a positive resist composition according to claim 9, wherein said phenol compound is selected from the group consisting of cresol, resorcinol, 2,4-dihydroxyphenyl propyl ketone, 2,3,4-trihydroxybenzophenone, 2,3,4,4'-tetrahydroxybenzophenone, 2,2-bis(2,4-dihydroxyphenyl)propane) and 2-(4-hydroxyphenyl)-2-(2,4-dihydroxyphenyl)propane.

11. The process for preparing a positive resist composition according to claim 1, wherein the condensation reaction solvent is selected from the group consisting of dioxane, methyl ethyl ketone, cyclohexanone, gamma-butyrolactone, and mixtures thereof.

12. The process for preparing a positive resist composition according to claim 1, wherein the condensation reaction solvent is one or more polar organic solvents.

13. The process for preparing a positive resist composition according to claim 1, wherein the quinone diazide sulfonyl halogenide is selected from the group consisting of 1,2-benzoquinone diazide-4-sulfonyl ester, 1,2-naphtho-quinone diazide-4-sulfonyl ester, and 1,2-naphthoquinone diazide-5-sulfonyl ester.

14. The process for preparing a positive resist composition according to claim 1, wherein the molar ratio of the phenol compound to the quinone diazide sulfonyl halogenide is from 1:1 to 1:4.

15. The process for preparing a positive resist composition according to claim 1, wherein the condensation reaction is carried out in the presence of a base catalyst.

16. The process for preparing a positive resist composition according to claim 15, wherein the base catalyst is selected from the group consisting of amines, inorganic bases and mixtures thereof.

17. The process for preparing a positive resist composition according to claim 15, wherein the base catalyst is present in an amount of from 1 to 1.5 moles per one mole of quinone diazide sulfonyl halogenide.

18. The process for preparing a positive resist composition according to claim 1, wherein the phenol compound is 2,3,4,4'-tetrahydroxybenzophenone and the quinone diazide sulfonyl halogenide is 1,2-naphthoquinone-2-diazide-5-sulfonyl chloride.

19. A process for preparing a positive resist composition, which process comprises the steps of:
    condensation reacting a quinone diazide sulfonyl halogenide with a phenol compound in a condensation reaction solvent in the presence of a vase catalyst to form a condensation reaction mixture;
    mixing the condensation reaction mixture with a solution of an alkali soluble resin in a resist solvent without isolating a quinone diazide sulfonyl ester from the condensation reaction mixture to form a second mixture;
    evaporating said condensation reaction solvent from the second mixture to form a third mixture;
    filtering the third mixture to remove salts produced by the condensation reaction;
    washing the third mixture with water to form a fourth mixture; and
    evaporating the water from said fourth mixture to prepare said positive resist composition;
    wherein the quinone diazide sulfonyl halogenide is selected from the group consisting of 1,2-benzoquinone diazide-4-sulfonyl ester, 1,2-naphthoquinone diazide-4-sulfonyl ester, and 1,2-naphthoquinone diazide-5-sulfonyl ester; wherein said phenol compound is selected from the group consisting of (poly)hydroxybenzenes, (poly)hydroxyphenyl alkyl ketones, (poly)hydroxyphenyl aryl ketones, bis{(poly)hydroxyphenyl}alkanes and (poly)hydroxyphenyl aryl alkanes; wherein the condensation reaction solvent is selected from the group consisting of dioxane, methyl ethyl ketone, cyclohexanone, gamma-butyrolactone, and mixtures thereof; wherein the molar ratio of the phenol compound to the quinone diazide sulfonyl halogenide is from 1:1 to 1:4; and wherein the weight ratio of the quinone diazide sulfonyl ester to the alkali-soluble resin is 1:1 to 1:1.5.

20. The process of claim 19, wherein the concentration of the alkali-soluble resin in the resist solvent is from 10 to 60% by weight.

21. The process of claim 19, which further comprises subjecting the prepared positive resist composition or one of the mixtures formed during the preparation thereof to filtration to remove dust impurities.

22. The process of claim 19, wherein said phenol compound is selected from the group consisting of cresol, resorcinol, 2,4-dihydroxyphenyl propyl ketone, 2,3,4-trihydroxybenzophenone, 2,3,4,4'-tetrahydroxybenzophenone, 2,3-bis(2,4-dihydroxyphenyl)propane) and 2-(4-hydroxyphenyl)-2-(2,4-dihydroxyphenyl)propane.

* * * * *